United States Patent
Oh

(10) Patent No.: US 9,805,768 B2
(45) Date of Patent: Oct. 31, 2017

(54) THREE-DIMENSIONAL (3D) NON-VOLATILE SEMICONDUCTOR MEMORY DEVICE FOR LOADING IMPROVEMENT

(71) Applicant: SK hynix Inc., Gyeonggi-do (KR)

(72) Inventor: Sung Lae Oh, Chungcheongbuk-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/752,444

(22) Filed: Jun. 26, 2015

(65) Prior Publication Data

US 2016/0275994 A1   Sep. 22, 2016

(30) Foreign Application Priority Data

Mar. 17, 2015  (KR) .......................... 10-2015-0036848

(51) Int. Cl.
  *G11C 5/02*   (2006.01)
  *G11C 7/18*   (2006.01)
  *G11C 5/06*   (2006.01)
  *G11C 8/14*   (2006.01)

(52) U.S. Cl.
  CPC ............... *G11C 5/02* (2013.01); *G11C 5/063* (2013.01); *G11C 7/18* (2013.01); *G11C 8/14* (2013.01)

(58) Field of Classification Search
  CPC .... G11C 5/02; G11C 5/06; G11C 7/10; G11C 8/10
  USPC ................................................ 365/51, 63, 72
  See application file for complete search history.

(56) References Cited

U.S. PATENT DOCUMENTS

| | | | |
|---|---|---|---|
| 8,338,882 B2 | 12/2012 | Tanaka et al. | |
| 2009/0027941 A1* | 1/2009 | Maejima | G11O 5/063 365/63 |
| 2010/0238732 A1* | 9/2010 | Hishida | G11C 16/0483 365/185.17 |
| 2012/0063194 A1* | 3/2012 | Baek | G11O 5/025 365/148 |
| 2014/0043902 A1 | 2/2014 | Unno | |

* cited by examiner

Primary Examiner — Tha-O H Bui
(74) Attorney, Agent, or Firm — IP & T Group LLP

(57) ABSTRACT

A three-dimensional (3D) non-volatile semiconductor memory device is disclosed. The three-dimensional (3D) non-volatile semiconductor memory device includes: a cell region having a plurality of memory cells; a page buffer formed to store data of the cell region in units of a page; a decoder formed below the cell region, configured to provide a word line voltage to word lines of the cell region; a first upper line formed above the cell region, configured to transfer the word line voltage; a lower interconnection structure formed below the cell region, configured to transfer the word line voltage to the decoder; and a first via disposed between the cell region and the page buffer, configured to couple the first upper line to the lower interconnection structure.

13 Claims, 6 Drawing Sheets

THREE-DIMENSIONAL (3D) NON-VOLATILE SEMICONDUCTOR MEMORY DEVICE FOR LOADING IMPROVEMENT

CROSS-REFERENCE TO RELATED APPLICATION

The present application claims priority under 35 U.S.C. 119(a) to Korean patent application No. 10-2015-0036848, filed on 17 Mar. 2015, the disclosure of which is hereby incorporated by reference in its entirety.

BACKGROUND OF THE INVENTION

Embodiments of the present disclosure relate to a non-volatile semiconductor device, and more particularly to a non-volatile semiconductor memory device configured to improve a structure of interconnection lines for a decoder in a semiconductor memory device having a PUC (Peri Under Cell) structure in which the decoder is located below a cell region.

Semiconductor memories are largely classified into volatile memory devices and non-volatile memory devices. A non-volatile memory device is a memory device capable of preserving stored data even when power supply interrupts. Various non-volatile memory devices such as flash memories have been widely used.

Since the integration enhancement of a two-dimensional (2D) non-volatile memory device in which a single-layered memory cell is formed over a semiconductor substrate is limited, there has been recently introduced a 3D non-volatile memory device in which memory cells are stacked along a channel layer vertically protruding from the semiconductor substrate.

The 3D non-volatile memory devices are largely classified into a first type of 3D non-volatile memory device having a line-shaped channel layer and a second type of 3D non-volatile memory device having a U-shaped channel layer. The 3D non-volatile memory device having the line-shaped channel layer includes a bit line and a source line respectively formed above and below stacked memory cells. In the 3D non-volatile memory device having the U-shaped channel layer, both of the bit line and the source line are disposed over stacked memory cells.

In addition, a PUC (Peri Under Cell) structure has recently been proposed in which a decoder is located below the cell region of a 3D non-volatile memory device. In a conventional PUC structure, metal lines are formed over and under the cell region, which are referred to as "upper metal line(s)" and "under metal line(s)," respectively. A decoder and a control circuit for supplying signals and power to the decoder are interconnected through the under-metal line.

However, since the under-metal line is formed of a material having higher resistance than an upper metal line, time for data or power transfer through the under metal line significantly increases and thus the operation characteristics of a chip are deteriorated. Additionally, the chip size unavoidably increases due to the presence of such under metal lines.

BRIEF SUMMARY OF THE INVENTION

Various embodiments of the present disclosure are directed to providing a non-volatile semiconductor memory device.

An embodiment of the present disclosure relates to a technology for improving an interconnection structure of lines such as, a signal line and power line for a decoder in a PUC-shaped non-volatile memory device, improving the operation characteristics of a chip, and preventing a chip size from increasing due to the presence of lines.

In accordance with an aspect of the present disclosure, a non-volatile semiconductor memory device includes: a cell region having a plurality of memory cells; a page buffer that stores data by unit page; a decoder formed below the cell region; a first upper line formed above the cell region; a lower interconnection structure formed below the cell region; and a first via disposed between the cell region and the page buffer, wherein a word line voltage is transferred from the first upper line through the first via, the lower interconnection structure, and the decoder to the cell region.

In accordance with an aspect of the present disclosure, a non-volatile semiconductor memory device includes: a cell region provided at a first level; a decoder provided at a second level lower than the first level; an upper bit line provided at a third level higher than the first level; an upper word line provided at a fourth level higher than the first level; and an under word line provided at a fifth level lower than the first level and coupling the upper word line to the decoder.

In accordance with an aspect of the present disclosure, a non-volatile semiconductor memory device includes: a cell region having a plurality of memory cells; a page buffer that stores data by unit page; a decoder formed below the cell region, configured to provide a word line voltage to word lines of the cell region; a first upper line formed above the cell region, configured to transfer the word line voltage; a lower interconnection structure formed below the cell region, configured to transfer the word line voltage to the decoder; and a first via disposed between the cell region and the page buffer, configured to couple the first upper line to the lower interconnection structure.

In accordance with an aspect of the present disclosure, an electronic device includes: a memory device configured to store data and read the stored data in response to a data input/output (I/O) control signal; and a memory controller configured to generate the data I/O control signal, and control data I/O operations of the memory device, wherein the memory device includes: a cell region having a plurality of memory cells; a page buffer that stores data by unit page; a decoder formed below the cell region; a first upper line formed above the cell region; a lower interconnection structure formed below the cell region; and a first via disposed between the cell region and the page buffer, wherein a word line voltage is transferred from the first upper line through the first via, the lower interconnection structure, and the decoder to the cell region.

It is to be understood that both the foregoing general description and the following detailed description of embodiments are exemplary and explanatory.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
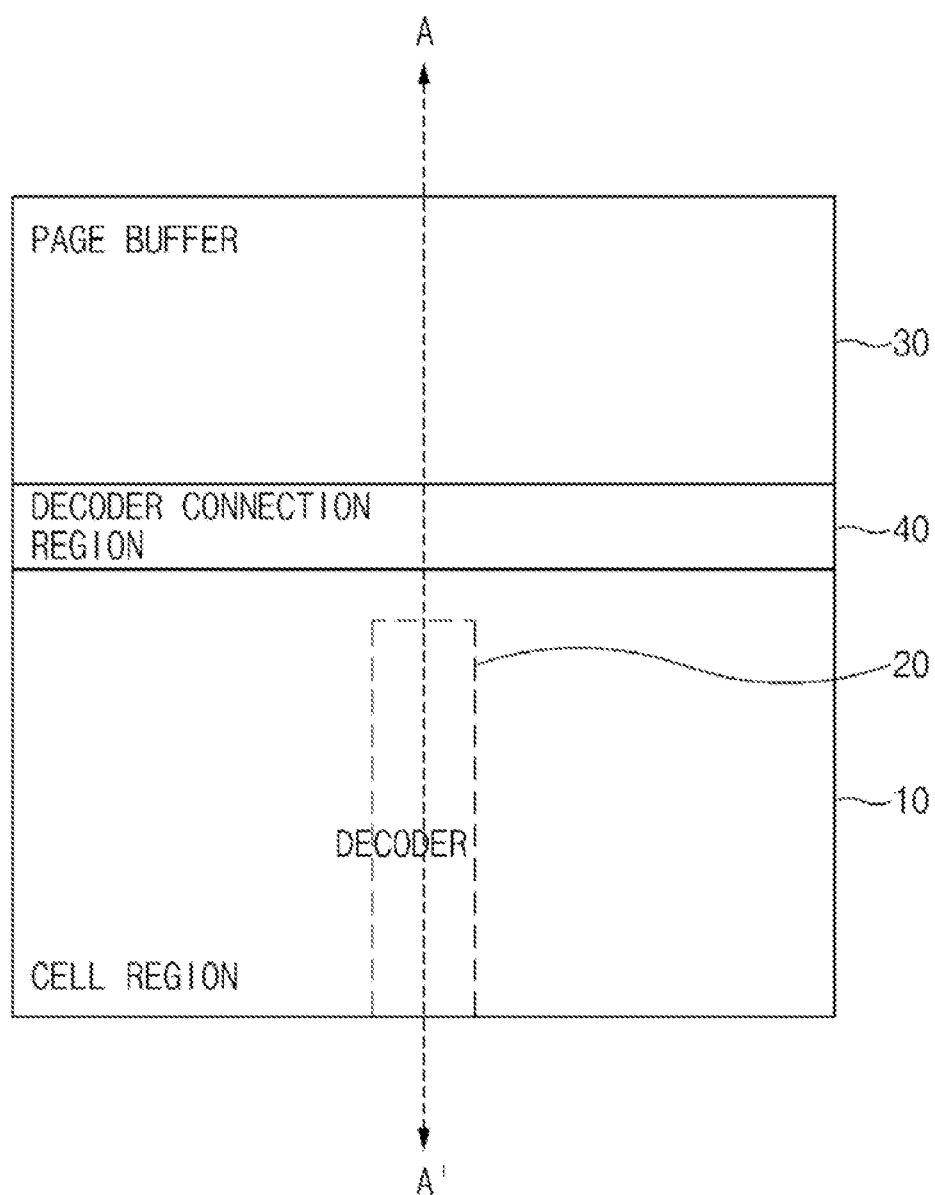
FIG. 1 illustrates an arrangement structure of a 3D non-volatile semiconductor device according to an embodiment.

FIG. 1 illustrates an arrangement structure of a 3D non-volatile semiconductor device according to an embodiment.

Referring to FIG. 1, a 3D non-volatile semiconductor device includes a cell region 10, a decoder 20, a page buffer 30, and a decoder connection region 40.

Figure 2A:
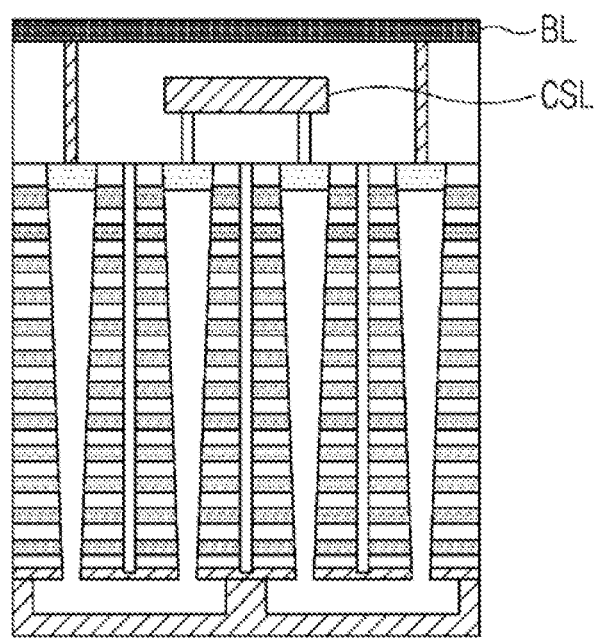
FIG. 2A illustrates a 3D cell array having a U-shaped channel layer.
Figure 2B:
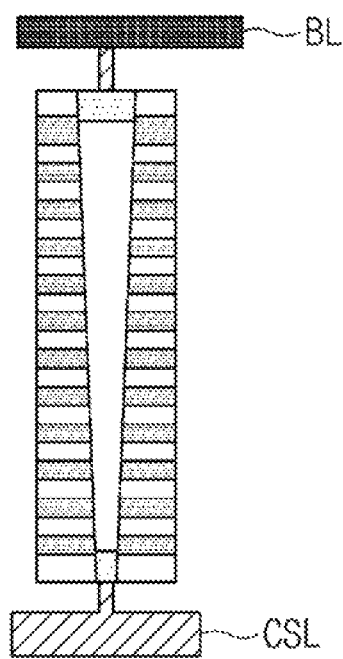
FIG. 2B illustrates a 3D cell array having a line-shaped channel layer.

The cell region 10 includes a plurality of memory cells configured to store data therein. In this case, the cell region 10 may include a 3D cell array in which several memory cells are formed in a string shape along a channel layer formed perpendicular to a semiconductor substrate. For example, the cell region 10 may include a 3D cell array having a U-shaped channel layer in which both a bit line BL and a source line CSL, are formed over a memory cell as shown in FIG. 2A. Alternately, the cell region 10 may include a 3D cell array having a line-shaped channel layer in which a bit line BL is formed over a memory cell and a source line CSL is formed below the memory cell.

The decoder 20 may output word line voltages for example, program voltage Vpgm and pass voltage Vpass, received through a global word line GWL to word lines of the cell region 10, so that the decoder 20 drives the word lines. The decoder 20 includes a passing gate suitable for selecting a first word line among a plurality of word lines included in the cell region and transferring the word line voltage from under metal lines formed below the cell region 10 to the selected first word line. The decoder 20 is located below the cell region 10, and is coupled to under metal lines.

The page buffer 30 is coupled to bit lines so that the page buffer 30 may latch data read from the cell region 10 by unit page before transferring the data to the bit line. In addition, the page buffer 30 may temporarily store data transferred from the bit lines before writing the data in the cell region 10.

The decoder connection region 40 may be disposed between the cell region 10 and the page buffer 30, and may include vias for coupling metal lines such as, upper metal lines formed above the cell region 10 to other metal lines such as, under metal lines formed below the cell region 10. For example, the decoder connection region 40 may include vias interconnecting upper metal lines and under metal lines. In addition, the decoder connection region 40 may include vias for coupling the upper metal line to an under metal line in such a manner that signals and power supplied through the upper metal line can be supplied to the decoder 20 through the under metal line.

Figure 3:
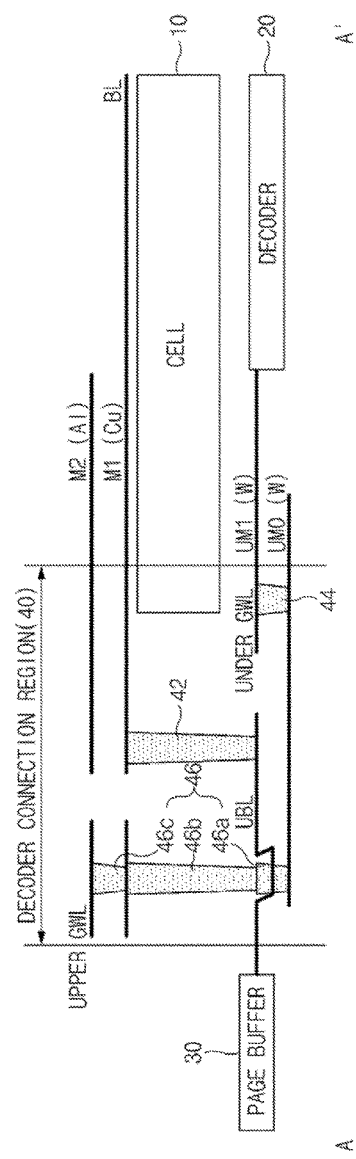
FIG. 3 is a cross-sectional view illustrating the semiconductor device taken along the line A-A' of FIG. 1.

FIG. 3 is a cross-sectional view illustrating the semiconductor device taken along the line A-A' of FIG. 1. FIG. 3 is a detailed diagram of the decoder connection region 40.

Upper metal lines (M1, M2) are stacked over the cell region 10, and under metal lines (UM0, UM1) are stacked below the cell region 10. The upper metal line M1 may be used as a bit line BL, hereinafter, referred to as an upper metal line. The upper metal line M2 formed over the upper metal line M1 may be coupled to a control circuit (Peri region). Specifically, the upper metal line M2 may include a signal line for example, a global word line GWL, and a power line supplying signals and power to the decoder 20, respectively. For convenience of description and better understanding of the present disclosure, lines supplying signals and power to the decoder 20 from the upper metal lines M2 will hereinafter be referred to as "upper GWL".

Some under metal lines UM1 are coupled to the decoder 20 and may be used as a signal line and a power line for respectively supplying signals and power to the decoder 20. For convenience of description and better understanding of the present disclosure, such lines for supplying signals and power to the decoder 20 from the under metal lines UM1 will hereinafter be referred to as "under GWL". In addition, some under metal lines UM1 may be used as bit lines or under bit lines UBL coupled to the page buffer 30. Under metal lines UM0 may be formed below the under metal lines UM1 and may be used as interconnection lines for coupling the under GWL to the upper GWL.

The upper metal line M1 may include copper (Cu), and the upper metal line M2 may include aluminum (Al). Under metal lines (UM0, UM1) may include tungsten (W). That is, the upper metal lines (M1, M2) may be formed of a conductive material having lower resistance than the under metal lines (UM0, UM1). Although FIG. 3 illustrates only the upper metal lines (M1, M2) for convenience of description, it should be noted that many more metal lines can be formed as necessary.

Via 42 may couple an upper bit line BL to an under bit line UBL. That is, the upper bit line BL is formed over the cell region 10 in which a 3D cell array is formed, so that there is a large step difference between the upper bit line BL and the under bit line UBL. Therefore, a via 42 for vertically coupling the upper bit line BL to the under bit line UBL may be formed in the decoder connection region 40 between the cell region 10 and the page buffer region n30.

In addition, according to the embodiment, vias (44, 46) for supplying signals and power received through the upper GWL to the decoder 20 may be formed in the decoder connection region 40. The via 44 may couple the under GWL to the under metal line UM0, and the via 46 may couple the under metal line UM0 to the upper GWL. The via 46 may be formed by stacking a plurality of vias (46a~46c). The via 46b may be formed by the same process as in the via 42. The via 46c may be formed by the same process as in the via 44.

Although the embodiment has exemplarily disclosed that the via 46 connects the upper GWL formed over the upper bit line BL to the under metal line UM0, the embodiment is not limited thereto. For example, in another embodiment, some parts, that are not used as the upper bit lines BL, from among the upper metal lines M1 may be coupled to a control circuit, and the via 46 may be formed to connect the some parts to the under meta line UM0.

Figure 4A:
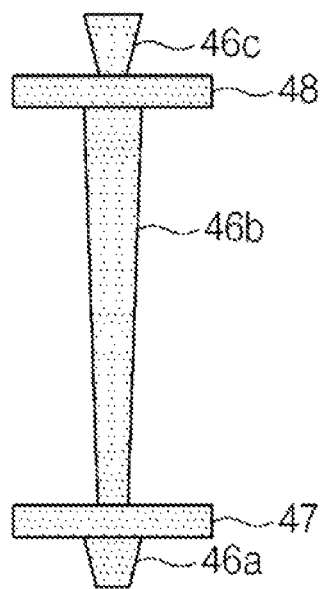
FIGS. 4A and 4B exemplarily illustrate that a pad is formed between vias shown in FIG. 3.
Figure 4B:
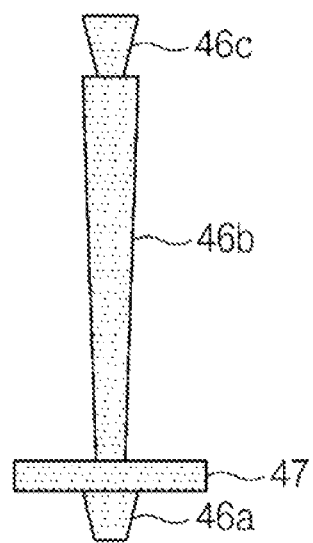

FIGS. 4A and 4B exemplarily illustrate that a pad is formed between vias shown in FIG. 3. Pads (47, 48) may be formed between the vias (46a~46c) as shown in FIG. 4A. The pad 47 may be patterned at the same time when the under metal line UM1 is formed, and the pad 48 may be patterned at the same time when the upper metal line M1 is formed. Alternatively, the pad 47 may also be formed between the vias (46a, 46b) as shown in FIG. 4B.

Through the structure shown in FIG. 3, the decoder 20 may be coupled to the control circuit (PERI) (not shown) through the under GWL, the via 44, the under metal line UM0, the via 46, and the upper GWL, so that the decoder 20 receives signals and power from the control circuit. As described above, in association with connection between the decoder 20 and the control circuit, under metal lines (UM0, UM1) are used only in some sections and upper metal lines having lower resistance than the under metal lines (UM0, UM1) are used in the remaining sections, resulting in reduction of time for signal loading. Specifically, when a metal line M2 formed of aluminum (Al) is used, time for signal loading can be significantly reduced then when the copper (Cu) metal line M1 is used.

As is apparent from the above description, the semiconductor device according to the embodiment improves an interconnection structure of lines for a decoder of a PUC-shaped 3D non-volatile memory device so as to improve the operation characteristics of a chip and thus prevents a chip size from increasing due to the presence of lines.

The above embodiments of the present disclosure are illustrative and not limitative. The above embodiments are not limited by the type of deposition, etching polishing, and patterning steps described herein. Nor are the above embodiments limited to any specific type of semiconductor device. For example, the present disclosure may be implemented in a dynamic random access memory (DRAM) device or non-volatile memory device.

What is claimed is:

1. A non-volatile semiconductor memory device comprising:
    a cell region having a plurality of memory cells;
    a page buffer that stores data by unit page and disposed a side of the cell region;
    a decoder connection region disposed between the cell region and the page buffer;
    a decoder disposed under the cell region and overlapped with the cell region in a vertical direction;
    an upper global word line disposed in the decoder connection region disposed over the decoder connection region;
    a lower interconnection structure disposed under the cell region and the decoder connection region, and coupled to the decoder; and
    a first via disposed in the decoder connection region and connecting the upper global word line and the lower interconnection structure,
    wherein a word line voltage is transferred from the upper global word line through the first via, the lower interconnection structure, and the decoder to the cell region.

2. The non-volatile semiconductor memory device according to claim 1, wherein the cell region is formed by stacking the plurality of memory cells in a string shape.

3. The non-volatile semiconductor memory device according to claim 1,
    wherein the decoder includes a passing gate suitable for selecting a first word line among a plurality of word lines included in the cell region and transferring the word line voltage from the lower interconnection structure to the selected first word line.

4. The non-volatile semiconductor memory device according to claim 1,
    wherein the upper global word line includes a conductive line located at a higher level than a bit line.

5. The non-volatile semiconductor memory device according to claim 1,
    wherein the upper global word line includes a conductive material having lower resistance than the lower interconnection structure.

6. The non-volatile semiconductor memory device according to claim 1, wherein the lower interconnection structure includes:
    an upper global word line coupled to the decoder;
    an interconnection line located below the under global word line and connected to the first via; and
    a second via that couples the under global word line to the interconnection line.

7. The non-volatile semiconductor memory device according to claim 1, further comprising:
    an upper bit line located above the cell region;
    an under bit line located below the cell region and coupled to the page buffer; and
    a third via disposed in the decoder connection region and coupling the upper bit line to the under bit line.

8. The non-volatile semiconductor memory device according to claim 7, wherein the upper bit line is located below the upper global word line.

9. A non-volatile semiconductor memory device comprising:
    a cell region provided at a first level;
    a decoder provided at a second level lower than the first level and overlapped with the cell region in a vertical direction;
    a decoder connection region provided at a side of the cell region;
    an upper bit line provided at a third level higher than the first level;
    an upper global word line provided at a fourth level higher than the first level in the decoder connection region;
    an under global word line provided at a fifth level lower than the first level and coupled to the decoder;
    an interconnection line provided at a sixth level lower than the first level and coupled to the under global word line; and
    a first via coupling the upper global word line to the interconnection line and provided in the decoder connection region.

10. The non-volatile semiconductor memory device of claim 9,
    wherein the third level is lower than the fourth level.

11. The non-volatile semiconductor memory device of claim 9, further comprising:
    an under bit line provided at the same level as the under global word line, and
    a second via coupling the under bit line to the upper bit line and provided in the decoder connection region.

12. The non-volatile semiconductor memory device of claim 9,
    wherein the sixth level is lower than the fifth level.

13. A non-volatile semiconductor memory device comprising:
    a cell region having a plurality of memory cells;
    a page buffer that stores data by unit page and disposed a side of the cell region;
    a decoder connection region disposed between the cell region and the page buffer;
    a decoder disposed under the cell region and overlapped with the cell region, configured to provide a word line voltage to word lines of the cell region;
    an upper global word line disposed in the decoder connection region, configured to transfer the word line voltage;
    a lower interconnection structure disposed under the cell region and the decoder connection region, configured to transfer the word line voltage to the decoder; and
    a first via disposed in the decoder connection region, configured to couple the upper global word line to the lower interconnection structure to transfer the word line voltage.

* * * * *